United States Patent
Kadoshima et al.

(10) Patent No.: US 7,323,381 B2
(45) Date of Patent: Jan. 29, 2008

(54) SEMICONDUCTOR DEVICE AND MANUFACTURING METHOD THEREOF

(75) Inventors: Masaru Kadoshima, Tsukuba (JP); Toshihide Nabatame, Tsukuba (JP)

(73) Assignee: Renesas Technology Corp., Tokyo (JP)

( * ) Notice: Subject to any disclaimer, the term of this patent is extended or adjusted under 35 U.S.C. 154(b) by 243 days.

(21) Appl. No.: 11/180,657

(22) Filed: Jul. 14, 2005

(65) Prior Publication Data
US 2006/0051915 A1 Mar. 9, 2006

(30) Foreign Application Priority Data
Sep. 7, 2004 (JP) .............................. 2004-259589

(51) Int. Cl.
*H01L 21/8238* (2006.01)

(52) U.S. Cl. ...................... 438/216; 438/199; 438/229; 257/412

(58) Field of Classification Search ................ 438/199, 438/275, 197, 585, 592, 230, 231, 285, 232, 438/407, 528, 655, 656, 659, 183, 303, 279; 257/204, 338, 369, 407, 288, 368, 408, 410, 257/411
See application file for complete search history.

(56) References Cited

U.S. PATENT DOCUMENTS

| | | | | |
|---|---|---|---|---|
| 6,043,157 | A * | 3/2000 | Gardner et al. ............. | 438/692 |
| 6,083,836 | A * | 7/2000 | Rodder ........................ | 438/690 |
| 6,475,908 | B1 * | 11/2002 | Lin et al. ..................... | 438/659 |
| 6,727,129 | B1 * | 4/2004 | Nakajima .................... | 438/197 |
| 6,750,519 | B2 * | 6/2004 | Lin et al. ..................... | 257/407 |
| 6,815,285 | B2 * | 11/2004 | Choi et al. ................... | 438/231 |
| 6,967,379 | B2 * | 11/2005 | Matsuo ........................ | 257/369 |
| 7,105,394 | B2 * | 9/2006 | Hachimine et al. ......... | 438/197 |
| 2002/0076886 | A1 * | 6/2002 | Rotondaro et al. ......... | 438/279 |
| 2003/0092285 | A1 * | 5/2003 | Hinoue et al. .............. | 438/770 |

(Continued)

FOREIGN PATENT DOCUMENTS

JP  2004-152995  10/2002

(Continued)

OTHER PUBLICATIONS

Hobbs et al., "Fermi-Level Pinning at the Polysilicon/Metal Oxide Interface—Part I", IEEE Transactions of Electron Devices, vol. 51. No. 6, Jun. 2004, pp. 971-984.

*Primary Examiner*—Zandra V. Smith
*Assistant Examiner*—Telly Green
(74) *Attorney, Agent, or Firm*—Reed Smith LLP; Stanley P. Fisher, Esq.; Juan Carlos A. Marquez, Esq.

(57) ABSTRACT

A structure of a MIS transistor for realizing a CMOS circuit capable of simultaneously achieving the high ON current and the low power consumption is provided. Each of the gate insulators of an n channel MIS transistor and a p channel MIS transistor is composed of a hafnium oxide ($HfO_2$) film. Also, the gate electrode of the n channel MIS transistor is composed of an Ni (nickel) silicide film, and the gate electrode of the p channel MIS transistor is composed of a Pt (platinum) film. In this structure, Fermi level pinning of the gate electrodes can be prevented. Therefore, the increase of the threshold voltage of the n channel MIS transistor and the p channel MIS transistor can be inhibited.

12 Claims, 13 Drawing Sheets

U.S. PATENT DOCUMENTS

| | | | |
|---|---|---|---|
| 2003/0218223 A1* | 11/2003 | Nishiyama et al. | 257/410 |
| 2004/0065930 A1 | 4/2004 | Lin et al. | |
| 2004/0080001 A1* | 4/2004 | Takeuchi | 257/407 |
| 2004/0084734 A1* | 5/2004 | Matsuo | 257/407 |
| 2004/0087070 A1 | 5/2004 | Nakajima | |
| 2005/0260810 A1* | 11/2005 | Cheng et al. | 438/199 |

FOREIGN PATENT DOCUMENTS

| | | |
|---|---|---|
| JP | 2004-158593 | 11/2002 |

* cited by examiner

|  | WORK FUNCTION | |
|---|---|---|
|  | SiO2 | HfO2 |
| p+poly Si | 5.17eV | 4.3-4.4eV |
| Pt | 5.0-5.2eV | 5.2-5.4eV |
| PtSi | 4.8-4.9eV | 4.5-4.6eV |
| NiSi | 4.6-4.7eV | 4.4-4.5eV |
| n+poly Si | 4.05eV | 4.2-4.3eV |

SEMICONDUCTOR DEVICE AND MANUFACTURING METHOD THEREOF

CROSS-REFERENCE TO RELATED APPLICATION

The present application claims priority from Japanese Patent Application NO. JP2004-259589 filed on Sep. 7, 2004, the content of which is hereby incorporated by reference into this application.

TECHNICAL FIELD OF THE INVENTION

The present invention relates to a semiconductor device and a manufacturing method thereof. More particularly, it relates to a technology effectively applied to a semiconductor device in which an n channel MIS transistor and a p channel MIS transistor each having a gate electrode formed on a Hf (hafnium)-based gate insulator are used to form a CMOS (Complementary Metal Oxide Semiconductor) circuit.

BACKGROUND OF THE INVENTION

Conventionally, in the n channel MOS transistor and the p channel MOS transistor which constitute a CMOS circuit, a silicon oxide film is used as a gate insulator material, and a polycrystalline silicon film or a laminated film (polycide film) obtained by laminating a metal silicide film such as a W (tungsten) silicide film or a Co (cobalt) silicide film on a polycrystalline silicon film is used as a gate electrode material formed on the gate oxide film.

Then, an n type impurity (phosphorus, arsenic or the like) is introduced into the polycrystalline silicon film constituting the gate electrode of the n channel MIS transistor to set the work function (Fermi level) of the gate electrode close to the conduction band of Si (approximately 4.05 eV). By doing so, the threshold voltage is reduced. Meanwhile, a p type impurity (boron or the like) is introduced into the polycrystalline silicon film constituting the gate electrode of the p channel MIS transistor to set the work function of the gate electrode close to the valence band of Si (approximately 5.17 eV). By doing so, the threshold voltage is reduced.

However, along with the miniaturization of the MIS transistors constituting the semiconductor integrated circuit, the thickness of the gate oxide film has been rapidly reduced in recent years. Consequently, when voltage is applied to the gate electrode to turn on the MIS transistor, the influence of the depletion in the gate electrode (polycrystalline silicon film) adjacent to the gate oxide film interface becomes increasingly significant, and the thickness of the gate oxide film is apparently increased. As a result, it becomes difficult to ensure the ON current and the operation speed of the transistor is significantly reduced.

Also, when the thickness of the gate oxide film is reduced, since the electrons pass through the gate oxide film due to the quantum effect called direct tunneling, the leakage current is increased. Furthermore, in the p channel MIS transistor, boron in the gate electrode (polycrystalline silicon film) diffuses in the substrate through the gate oxide film, and the impurity concentration of the channel region is increased. Therefore, the threshold voltage fluctuates.

For its solution, the replacement of the gate insulator material from the silicon oxide to the insulator with a higher dielectric constant (high dielectric constant film) and the replacement of the gate electrode material from the polycrystalline silicon (or polycide) to the metal silicide or metal have been examined (for example, Japanese Patent Laid-Open Publication No. 2004-158593, Japanese Patent Laid-Open Publication No. 2004-152995, US Patent Application Publication No. 2004/0065930A1, U.S. Pat. No. 6,475,908 B1 and U.S. Pat. No. 6,750,519 B2).

This is because, when the high dielectric constant film is used to constitute the gate insulator, the actual physical thickness can be increased by a factor of "dielectric constant of a high dielectric constant film/dielectric constant of a silicon oxide film" without changing the capacitance of the equivalent silicon oxide thickness (EOT), and as a result, the leakage current can be reduced. As a high dielectric constant material, various metal oxides such as Hf (hafnium) oxide and Zr (zirconium) oxide have been examined.

In addition, when a material not containing polycrystalline silicon is used to constitute the gate electrode, the reduction of the ON current due to the depletion and the boron leakage from the gate electrode to the substrate can be prevented.

Japanese Patent Laid-Open Publication No. 2004-158593, Japanese Patent Laid-Open Publication No. 2004-152995, and US Patent Publication No. 2004/0065930 A1 disclose the method of forming a p channel MIS transistor and an n channel MIS transistor. In this method, when forming an n channel MIS transistor and a p channel MIS transistor, after forming a silicon-based gate insulator and further a high dielectric constant film as the gate insulator, a metal film such as Pt (platinum), Ti (titanium), Ni (nickel), Co, Ta (tantalum) or Zr is deposited, and silicon is ion-implanted into one metal film to form metal silicide with using the other metal film as a mask, and then, an electrode of the metal film and an electrode of the metal silicide film are respectively formed. In this case, a material with a high work function is used for the p channel MIS transistor, and a material with a low work function is used for the n channel MIS transistor.

Also, US Patent Publication No. 2004/0065930 A1, U.S. Pat. No. 6,475,908 B1 and U.S. Pat. No. 6,750,519 B2 disclose the list of the work function of metals. Note that, it is estimated that the work function shown in the list is measured directly from the metal films.

The work function of a gate electrode formed on a silicon-based gate insulator such as a silicon oxide film and a silicon oxynitride film is reflected relatively directly in the electrical characteristics. However, when a high dielectric constant material represented by Hf-based oxide is used for the gate insulator, the effective work function is varied in comparison to the case where the silicon-based gate insulator is used, and it is interpreted as the Fermi level pinning (IEEE TRANSACTIONS ON ELECTRON DEVICES, VOL. 51, NO. 6, JUNE 2004, PP. 971 TO 984).

SUMMARY OF THE INVENTION

The low power consumption design is important in the CMOS circuit, and the reduction of the threshold voltage of the n channel MIS transistor and the p channel MIS transistor is required for its achievement.

Therefore, even when a high dielectric constant film such as a Hf oxide is used as a gate insulator material and metal silicide or metal is used as a gate electrode material instead of the polycrystalline silicon (or polycide), it is necessary to select gate electrode materials with a suitable work function so as to prevent the increase of the threshold voltage in the n channel MIS transistor and the p channel MIS transistor.

In the conventional technology described above, however, the Fermi level pinning in which the effective work function of metal silicide formed on a high dielectric constant film is varied when a high dielectric constant film is used as a gate insulator instead of a silicon oxide film is not considered at all.

For example, Japanese Patent Laid-Open Publication No. 2004-158593 discloses a p channel MISFET in which a gate electrode composed of a laminated film of a W (tungsten) film and a platinum silicide film is formed on a gate insulator made of a hafnium oxide film. Also, it says that "the work function of the platinum silicide and tungsten is about 4.8 to 4.9 eV, which is suitable as the gate electrode of the p channel MISFET" (paragraph 0038 in the specification).

However, according to the examination by the inventors of the present invention, as shown in FIG. 2, when a gate electrode made of silicide of VIII group element such as PtSi and NiSi is formed on the hafnium-based gate insulator, the reduction of the effective work function due to the Fermi level pinning is observed in comparison to the case where the gate electrode is formed on a silicon-based gate insulator. Meanwhile, when a gate electrode made of VIII group element such as Pt is formed on a hafnium-based gate insulator, the Fermi level pinning as described above does not occur and the increase of the effective work function is observed in contrast.

For example, in the case of the gate electrode made of Pt. silicide, the work function thereof on the silicon oxide film is 4.8 to 4.9 eV, whereas the effective work function thereof on the hafnium oxide film is 4.5 to 4.6 eV and the Fermi level pinning in the direction of the conduction band of Si is observed. More specifically, when a Pt silicide film is used to constitute the gate electrode of the p channel MIS transistor having a gate insulator formed of a hafnium oxide film, the threshold voltage of the p channel MIS transistor is increased, and thus, the low power consumption design of the CMOS circuit becomes difficult.

Also, in the case of the gate electrode made of Ni silicide, the work function thereof on the silicon oxide film is 4.6 to 4.7 eV, whereas the effective work function thereof on the hafnium oxide film is 4.4 to 4.5 eV and the Fermi level pinning in the direction of the conduction band of Si is also observed. More specifically, the threshold voltage of the p channel MIS transistor is increased even when an Ni silicide film is used to constitute the gate electrode of the p channel MIS transistor having a gate insulator formed of a hafnium oxide film.

More specifically, when a Pt silicide film is used to constitute the gate electrode of the p channel MIS transistor having a gate insulator formed of a hafnium oxide film, the threshold voltage of the p channel MIS transistor is increased. Therefore, the low power consumption design of the CMOS circuit becomes difficult.

Also, in the conventional technology in which silicon is ion-implanted into a metal film to form a metal silicide film, the peeling and the breakage of a metal film may occur depending on the amount of implanted silicon. Furthermore, when a large amount of silicon is implanted into an insulator region other than the metal film, the insulation efficiency of the insulator is degraded.

An object of the present invention is to provide a technology for realizing a CMOS circuit capable of simultaneously achieving the high ON current and the low power consumption.

The above and other objects and novel characteristics of the present invention will be apparent from the description of this specification and the accompanying drawings.

The typical ones of the inventions disclosed in this application will be briefly described as follows.

According to the present invention, in a semiconductor device in which an n channel MIS transistor is formed in a first region on a main surface of a semiconductor substrate made of single crystal silicon and a p channel MIS transistor is formed in a second region on the main surface, the n channel MIS transistor comprises a gate electrode composed of a metal silicide film on a gate insulator mainly containing hafnium oxide, and the p channel MIS transistor comprises a gate electrode composed of a metal film on a gate insulator mainly containing the hafnium oxide.

The metal film constituting a gate electrode of the p channel MIS transistor is made of a VIII group element.

The metal film constituting the gate electrode of the p channel MIS transistor is a platinum film, a nickel film or a ruthenium film.

A metal film used to form a metal silicide film constituting the gate electrode of the n channel MIS transistor and a metal film constituting the gate electrode of the p channel MIS transistor are made of elements different from each other.

The metal silicide film constituting the gate electrode of the n channel MIS transistor is made of silicide compound of the VIII group element.

The metal silicide film constituting the gate electrode of the n channel MIS transistor is a platinum silicide film, a nickel silicide film or a ruthenium silicide film.

The metal silicide film constituting the gate electrode of the n channel MIS transistor is made of silicide compound of the metal film which constitutes the gate electrode of the p channel MIS transistor.

A part of the gate electrode of the n channel MIS transistor which comes in contact with the gate insulator is composed of the metal silicide film, and a diffusion barrier film is laminated on the metal silicide film.

The gate insulator mainly contains at least one kind of hafnium oxide selected from a group including HfO, Hf—Si—O, Hf—Si—O—N, Hf—Al—O and Hf—Al—O—N.

Also, in the present invention, the semiconductor device described above is manufactured through the steps of:

(a) forming a gate insulator mainly containing hafnium oxide on the main surface of the semiconductor substrate;

(b) forming a first silicon gate electrode of the n channel MIS transistor on the gate insulator in the first region and forming a second silicon gate electrode of the p channel MIS transistor on the gate insulator in the second region;

(c) depositing a first insulator with a thickness larger than that of the first and second silicon gate electrodes on the main surface of the semiconductor substrate, and then, planarizing the surface of the first insulator, thereby exposing each of the surfaces of the first and second silicon gate electrodes on the surface of the first insulator;

(d) selectively covering the surface of the second silicon gate electrode exposed on the surface of the first insulator with a second insulator, and then, forming a first metal film on the first and second insulators;

(e) heating the semiconductor substrate to react the first silicon gate electrode with the first metal film, thereby converting the first silicon gate electrode of the n channel MIS transistor into a metal silicide gate electrode;

(f) removing the second insulator, and then, removing the second silicon gate electrode; and (g) after the step (f), filling a gap formed by the removal of the second silicon gate electrode with a second metal film, thereby forming a metal gate electrode of the p channel MIS transistor.

The effect obtained by the representative one of the inventions disclosed in this application will be briefly described as follows.

A silicide gate electrode formed by the solid-phase reaction and a metal gate electrode are formed on a gate insulator mainly made of hafnium oxide in the n channel MIS transistor and the p channel MIS transistor, respectively. By doing so, the reduction of the threshold voltage can be achieved more effectively. Therefore, the CMOS circuit capable of simultaneously achieving the high ON current and the low power consumption can be realized.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments and the repetitive description thereof will be omitted.

First Embodiment

Figures 1, 2:
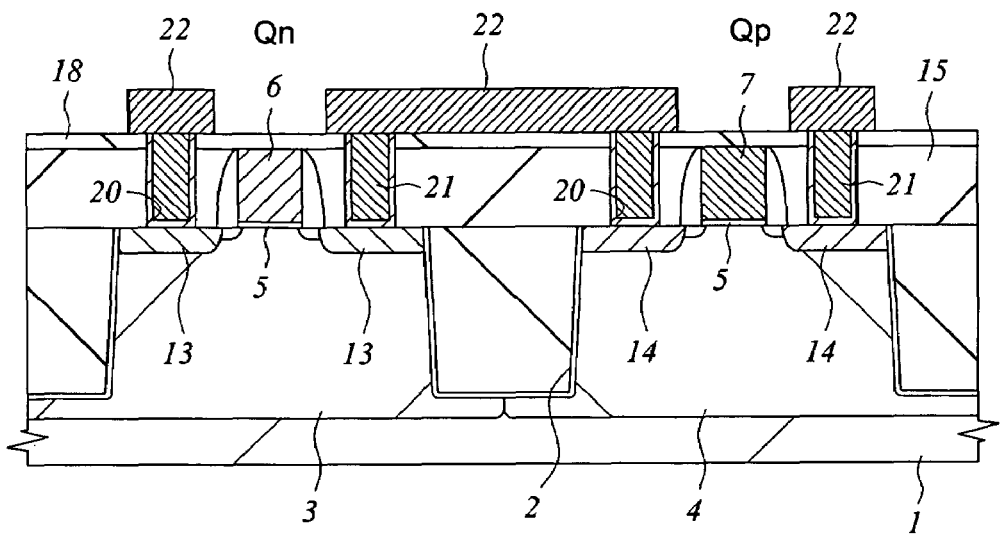
FIG. 1 is a cross-sectional view of a semiconductor substrate on which an n channel MIS transistor and a p channel MIS transistor according to an embodiment of the present invention are formed.
FIG. 2 is a table showing the effective work function of gate electrode materials on the silicon oxide film and the hafnium oxide film.

FIG. 1 is a cross-sectional view showing a semiconductor substrate (hereinafter, referred to as substrate) 1 on which an n channel MIS transistor (Qn) and a p channel MIS transistor (Qp) according to this embodiment are formed.

A p type well 3 and an n type well 4 whose areas are defined by device isolation trenches 2 are formed on the main surface of the substrate 1 made of p type single crystal silicon. The n channel MIS transistor (Qn) is formed on the p type well 3, and the p channel MIS transistor (Qp) is formed on the n type well 4.

The n channel MIS transistor (Qn) is provided with a gate insulator 5 formed on the surface of the p type well 3, a gate electrode 6 formed on the gate insulator 5 and n+ type semiconductor regions (source, drain) 13 formed in the p type well 3. Also, the p channel MIS transistor (Qp) is provided with a gate insulator 5 formed on the surface of the n type well 4, a gate electrode 7 formed on the gate insulator 5 and p+ type semiconductor regions (source, drain) 14 formed in the n type well 4.

Metal wirings 22 are connected to the n+ type semiconductor regions (source, drain) 13 of the n channel MIS transistor (Qn) via plugs 21 in contact holes 20 formed in the silicon oxide films 15 and 18. Similarly, metal wirings 22 are connected to the p+ type semiconductor regions (source, drain) 14 of the p channel MIS transistor (Qp) via plugs 21 in contact holes 20 formed in the silicon oxide films 15 and 18.

Each of the gate insulators 5 of the n channel MIS transistor (Qn) and the p channel MIS transistor (Qp) is composed of a hafnium oxide ($HfO_2$) film. Also, the gate electrode 6 of the n channel MIS transistor (Qn) is composed of a Ni (nickel) silicide film and the gate electrode 7 of the p channel MIS transistor (Qp) is composed of a Pt (platinum) film.

As described above, since hafnium oxide with the dielectric constant higher than that of silicon oxide and silicon oxynitride is used to constitute the gate insulator 5 in the n channel MIS transistor (Qn) and the p channel MIS transistor (Qp) in this embodiment, the actual physical thickness can be increased without changing the capacitance of the equivalent silicon oxide thickness (EOT). Therefore, the leakage current due to the direct tunneling can be reduced.

Also, the gate electrodes 6 and 7 of the n channel MIS transistor (Qn) and the p channel MIS transistor (Qp) according to this embodiment are made of a material not containing polycrystalline silicon. Therefore, the reduction of the ON current due to the depletion, which causes a problem in the gate electrode which contains polycrystalline silicon, can be prevented. Further, since the gate electrode 7 of the p channel MIS transistor (Qp) does not contain boron, the variation of threshold voltage due to the leakage of boron to the substrate, which causes a problem in the polycrystalline silicon gate electrode which contains boron, can be prevented.

FIG. 2 is a table showing the effective work function of gate electrode materials (p+ polycrystalline silicon, n+ polycrystalline silicon, Pt, Pt silicide and Ni silicide) on the silicon oxide film and the hafnium oxide film.

As shown in FIG. 2, in the case of the gate electrode made of Ni silicide, the work function thereof on the silicon oxide film is 4.6 to 4.7 eV, whereas the work function thereof on the hafnium oxide film is 4.4 to 4.5 eV and the shift (Fermi level pinning) in the direction of the conduction band of Si (silicon) is observed. Similarly, in the case of the gate electrode made of Pt silicide, the work function thereof on the silicon oxide film is 4.8 to 4.9 eV, whereas the work function thereof on the hafnium oxide film is 4.5 to 4.6 eV and the Fermi level pinning in the direction of the conduction band of Si is observed.

More specifically, when an Ni silicide film and a Pt silicide film are used to constitute the gate electrode of the p channel MIS transistor having a gate insulator composed of a hafnium oxide film, the threshold voltage of the p channel MIS transistor is increased. Therefore, the low power consumption design of the CMOS circuit is difficult.

Meanwhile, when a Pt film is used to constitute the gate electrode 7 like in the p channel MIS transistor (Qp) according to this embodiment, the work function thereof on a silicon oxide film is 5.0 to 5.2 eV, and the work function thereof on a hafnium oxide film is 5.2 to 5.4 eV and the Fermi level pinning in the direction of the conduction band of Si does not occur. Therefore, the increase of the threshold voltage can be inhibited.

On the other hand, the gate electrode 6 of the n channel MIS transistor (Qn) is formed on the gate insulator 5 composed of a hafnium oxide film and is composed of an Ni silicide film which causes the Fermi level pinning in the direction of the conduction band of Si. Therefore, the increase of the threshold voltage can be inhibited.

Consequently, when the n channel MIS transistor (Qn) and the p channel MIS transistor (Qp) according to this embodiment are used to constitute the CMOS circuit, the CMOS circuit capable of achieving the high ON current and the low power consumption can be realized.

Also, in the case where an Ni silicide film is used to constitute the gate electrode 6 of the n channel MIS transistor (Qn), a polycrystalline silicon film is once formed to constitute the gate electrode and then this polycrystalline silicon film is silicided to form the gate electrode 6. Consequently, the conventional manufacturing process of a MIS transistor having a gate electrode composed of a polycrystalline silicon film can be used. Therefore, it is unnecessary to significantly modify the conventional process design.

Next, the manufacturing method of an n channel MIS transistor (Qn) and a p channel MIS transistor (Qp) shown in FIG. 1 will be described with reference to FIG. 3 to FIG. 14.

Figure 3:
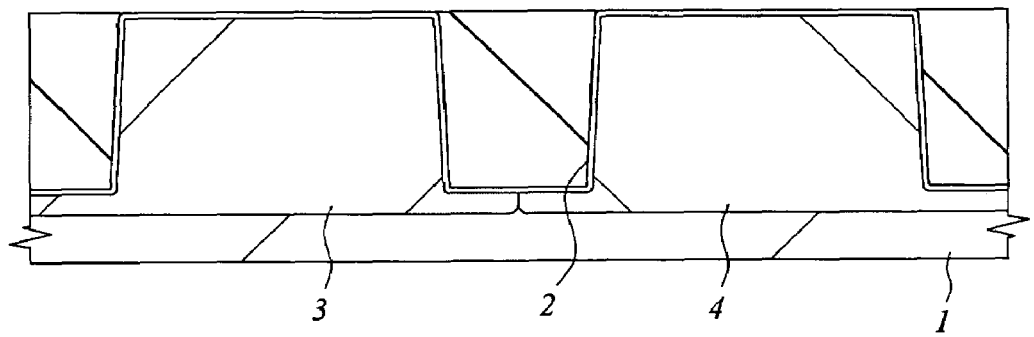
FIG. 3 is a cross-sectional view of the semiconductor substrate showing the manufacturing method of the n channel MIS transistor and the p channel MIS transistor according to an embodiment of the present invention.

First, as shown in FIG. 3, device isolation trenches 2 are formed by the conventionally-known STI (Shallow Trench Isolation) technique on the main surface of the substrate 1 made of p type single crystal silicon. Thereafter, boron is ion-implanted into n channel MIS transistor forming regions of the substrate 1, and phosphorus is ion-implanted into p channel MIS transistor forming regions of the substrate 1. Subsequently, the p type well 3 and the n type well 4 are formed in the substrate 1 by the thermal treatment of the substrate 1 to diffuse the above-mentioned impurity (boron, phosphorus) into the substrate 1.

Figure 4:
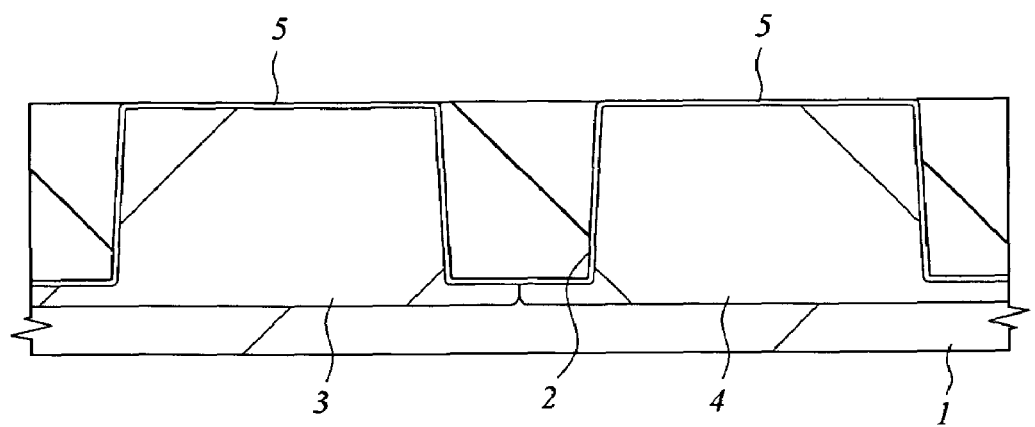
FIG. 4 is a cross-sectional view of the semiconductor substrate showing the manufacturing method of the n channel MIS transistor and the p channel MIS transistor subsequent to FIG. 3.

Next, impurities for controlling the threshold voltage of the MIS transistors are ion-implanted into the respective surfaces of the p type well 3 and the n type well 4. Thereafter, as shown in FIG. 4, the gate insulators 5 composed of a hafnium oxide film are formed on the respective surfaces of the p type well 3 and the n type well 4. The hafnium oxide film is deposited by the CVD or the ALD (Atomic Layer Deposition), and the thickness thereof is about 1.5 to 4.0 nm. Alternatively, after a thin silicon oxide film with a thickness of about 0.4 to 1.5 nm is formed by the conventionally-known wet oxidation method on the surface of the substrate 1, a hafnium oxide film is deposited on the silicon oxide film by the above-mentioned method to form the laminated film of the silicon oxide film and the silicon hafnium film. This laminated film can be used to constitute the gate insulator 5. In this case, a silicon oxynitride film can be used instead of the lower silicon oxide film.

In this embodiment, the gate insulator 5 is composed of a hafnium oxide film or a laminated film of a silicon oxide (oxynitride) film and a hafnium oxide film. Alternatively, hafnium-based insulator other than the hafnium oxide film, for example, Hf—Si—O film, Hf—Si—O—N film, Hf—Al—O film and Hf—Al—O—N film is also available. In addition, it is also preferable to introduce oxide such as tantalum oxide, niobium (Nb) oxide, titanium oxide, zirconium oxide, lanthanum oxide, yttrium oxide and the like into the hafnium-based insulator. Similar to a hafnium oxide film, these hafnium-based insulators have a dielectric constant higher than that of a silicon oxide film and a silicon oxynitride film. Therefore, it is possible to obtain the effect equivalent to the case using a hafnium oxide film. These hafnium-based insulators can be deposited by the CVD, ALD, or sputtering method.

Figure 5:
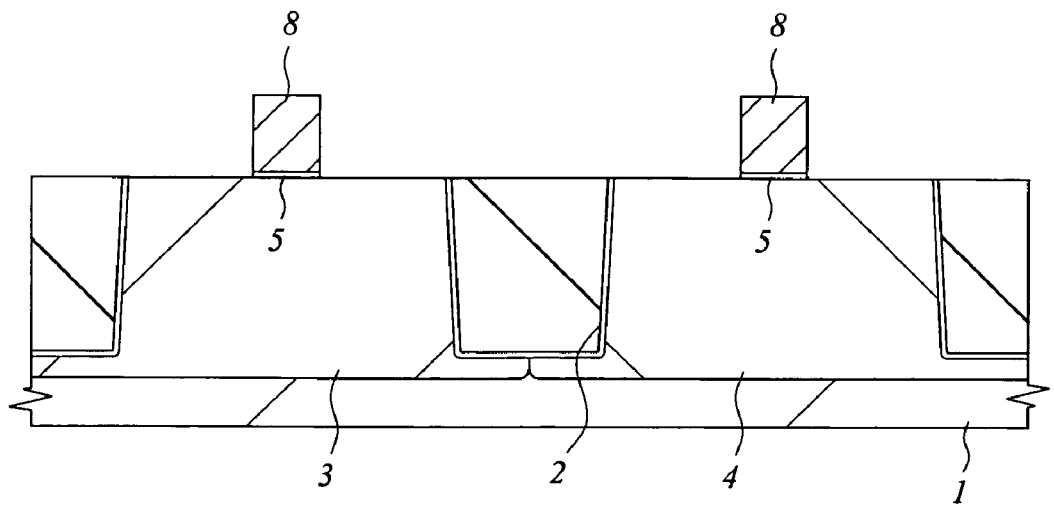
FIG. 5 is a cross-sectional view of the semiconductor substrate showing the manufacturing method of the n channel MIS transistor and the p channel MIS transistor subsequent to FIG. 4.

Next, as shown in FIG. 5, after depositing a polycrystalline silicon film (or amorphous silicon film) on the substrate 1 by the CVD, the polycrystalline silicon film is patterned by the dry etching using a photoresist film as a mask. By doing so, silicon gate electrodes 8 are formed on the respective gate insulators 5 of the p type well 3 and the n type well 4. At this time, the gate insulator 5 except those below the gate electrodes 8 is also removed.

Figure 6:
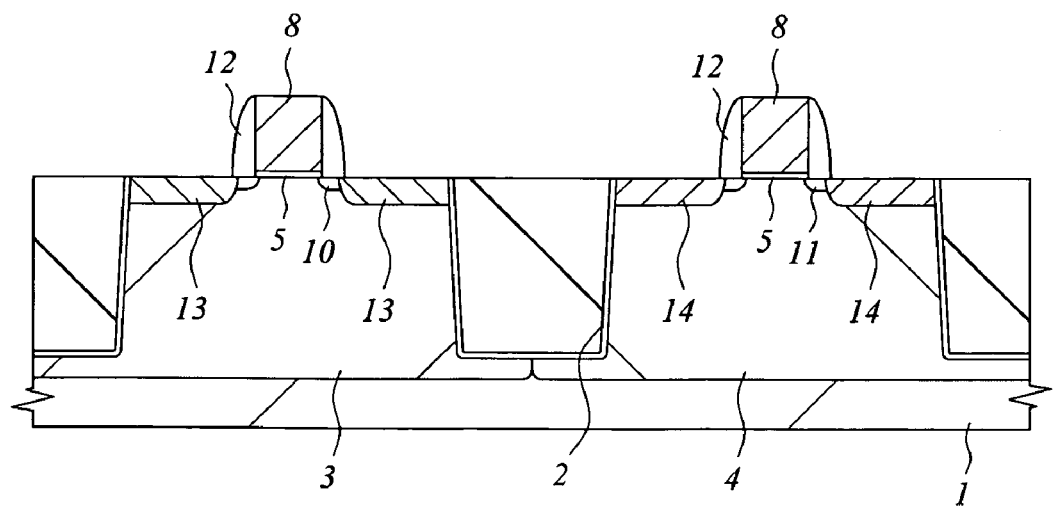
FIG. 6 is a cross-sectional view of the semiconductor substrate showing the manufacturing method of the n channel MIS transistor and the p channel MIS transistor subsequent to FIG. 5.

Next, as shown in FIG. 6, arsenic or phosphorus is ion-implanted into the p type well 3 to form n– type semiconductor regions 10 and boron is ion-implanted into the n type well 4 to form p– type semiconductor regions 11. Thereafter, sidewall spacers 12 are formed on the sidewalls of the silicon gate electrodes 8. The sidewall spacer 12 is formed by depositing a silicon oxide film by the CVD on the substrate 1 and subsequently performing the anisotropic etching of the silicon oxide film. The n– type semiconductor regions 10 are formed in order to form the LDD (Lightly Doped Drain) structure in the n channel MIS transistor (Qn), and the p– type semiconductor regions 11 are formed in order to form the LDD (Lightly Doped Drain) structure in the p channel MIS transistor (Qp).

Subsequently, after arsenic or phosphorus is ion-implanted into the p type well 3 and boron is ion-implanted into the n type well 4, these impurities are diffused by the thermal treatment of the substrate 1. By doing so, the n+ type semiconductor regions (source, drain) 13 are formed in the p type well 3 and the p+ type semiconductor regions (source, drain) 14 are formed in the n type well 4.

Figure 7:
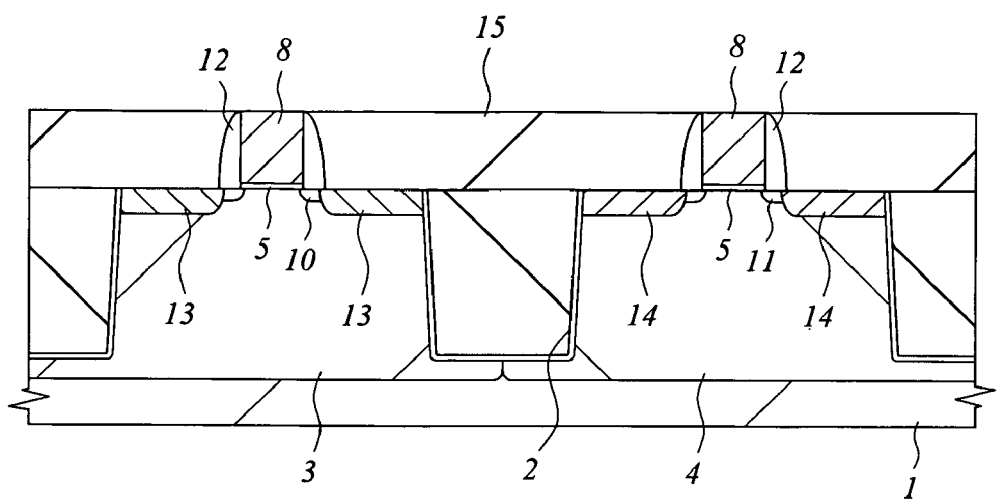
FIG. 7 is a cross-sectional view of the semiconductor substrate showing the manufacturing method of the n channel MIS transistor and the p channel MIS transistor subsequent to FIG. 6.

Next, as shown in FIG. 7, after depositing a silicon oxide film 15 on the substrate 1 by the CVD, the surface of the silicon oxide film 15 is polished and planarized by the chemical mechanical polishing, thereby exposing the surface of the silicon gate electrodes 8 on the surface of the silicon oxide film 15.

Figure 8:
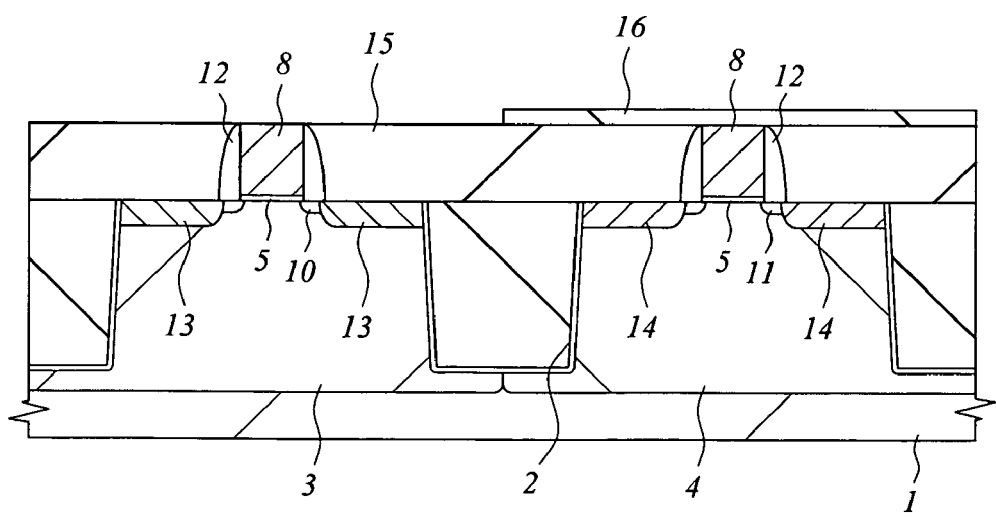
FIG. 8 is a cross-sectional view of the semiconductor substrate showing the manufacturing method of the n channel MIS transistor and the p channel MIS transistor subsequent to FIG. 7.

Next, as shown in FIG. 8, after depositing a silicon nitride film 16 on the substrate 1 by the CVD, the silicon nitride film 16 above the p type well 3 is selectively removed by the dry etching using a photoresist film as a mask, thereby exposing the surface of the silicon gate electrode 8 on the side of the p type well 3 again.

Figure 9:
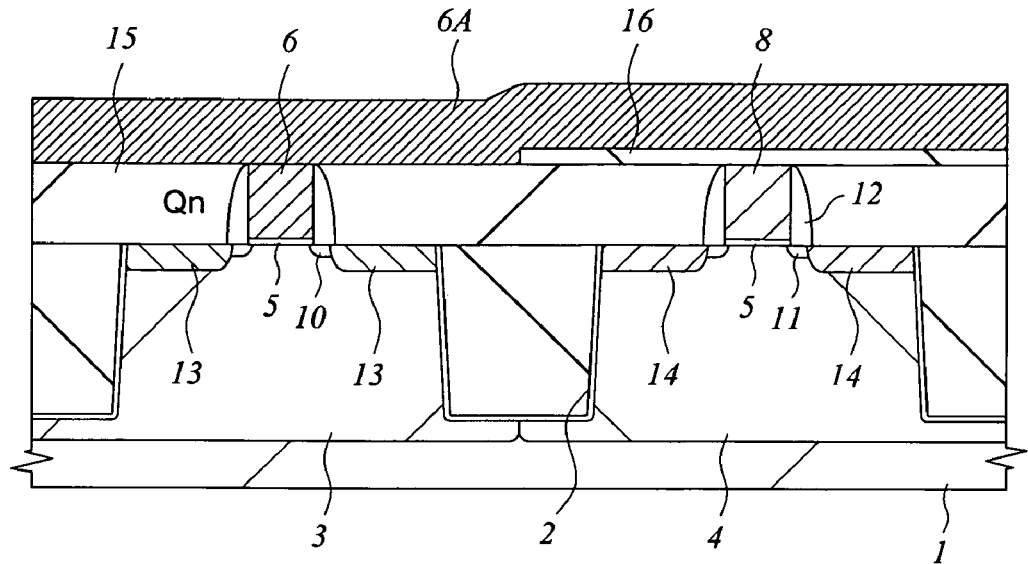
FIG. 9 is a cross-sectional view of the semiconductor substrate showing the manufacturing method of the n channel MIS transistor and the p channel MIS transistor subsequent to FIG. 8.

Next, as shown in FIG. 9, after depositing an Ni film 6A on the substrate 1 by the sputtering method, the substrate 1 is heated to about 400° C. By this heat treatment, the silicide reaction occurs from the interface between the silicon gate electrode 8 on the side of the p type well 3 and the Ni film 6A deposited thereon, and the silicon gate electrode 8 is converted into an Ni silicide film. Through the process as described above, the n channel MIS transistor (Qn) having a gate electrode 6 composed of the Ni silicide film is formed on the p type well 3. On the other hand, since the surface of the silicon gate electrode 8 on the n type well 4 is covered with the silicon nitride film 16, the silicon gate electrode 8 on the n type well 4 does not react with the Ni film 6A even by the thermal treatment described above.

Figure 10:
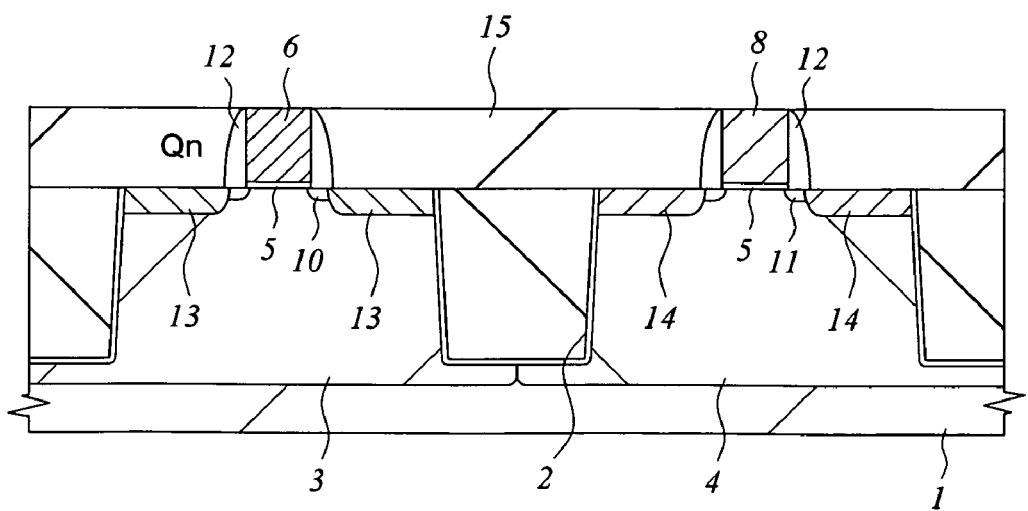
FIG. 10 is a cross-sectional view of the semiconductor substrate showing the manufacturing method of the n channel MIS transistor and the p channel MIS transistor subsequent to FIG. 9.

Next, as shown in FIG. 10, the Ni film 6A is removed by the wet etching using strong acid or the chemical mechanical polishing. Subsequently, the silicon nitride film 16 is removed by the wet etching using the thermal phosphoric acid, thereby exposing the surface of the silicon gate electrode 8 on the n type well 4.

Figure 11:
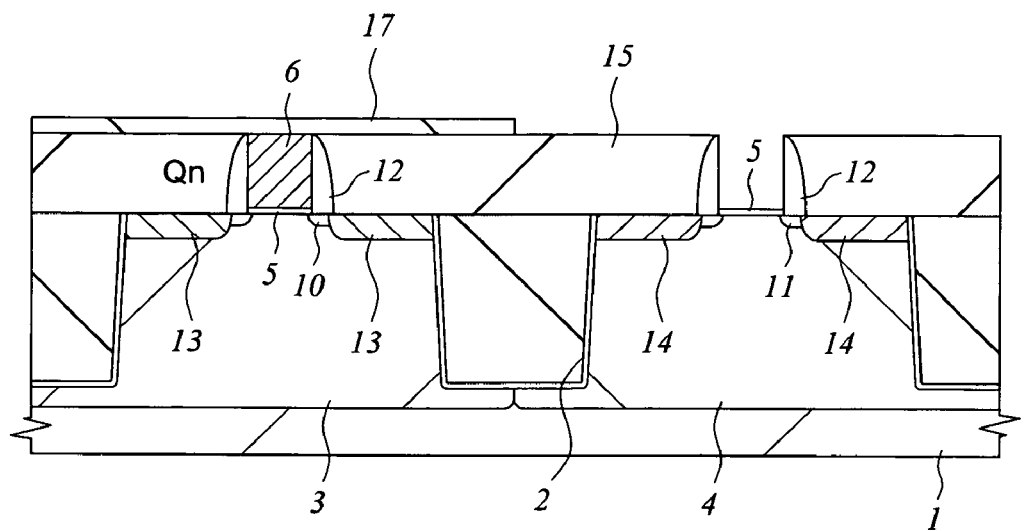
FIG. 11 is a cross-sectional view of the semiconductor substrate showing the manufacturing method of the n channel MIS transistor and the p channel MIS transistor subsequent to FIG. 10.

Next, as shown in FIG. 11, after depositing a silicon nitride 17 on the substrate 1 by the CVD, the silicon nitride film 17 on the n type well 4 is selectively removed by the dry etching using a photoresist film as a mask, thereby exposing the surface of the silicon gate electrode 8 again. Subsequently, the silicon gate electrode 8 is removed by the dry etching or the wet etching, thereby exposing the gate insulator 5 on the surface of the n type well 4. Note that, if the silicon gate electrode 8 is removed by the etching in which the etching selectivity to silicon is higher than that to Ni silicide, it is not always necessary to cover the gate electrode 6 composed of an Ni silicide film of the n channel MIS transistor (Qn) with the silicon nitride film 17.

Figure 12:
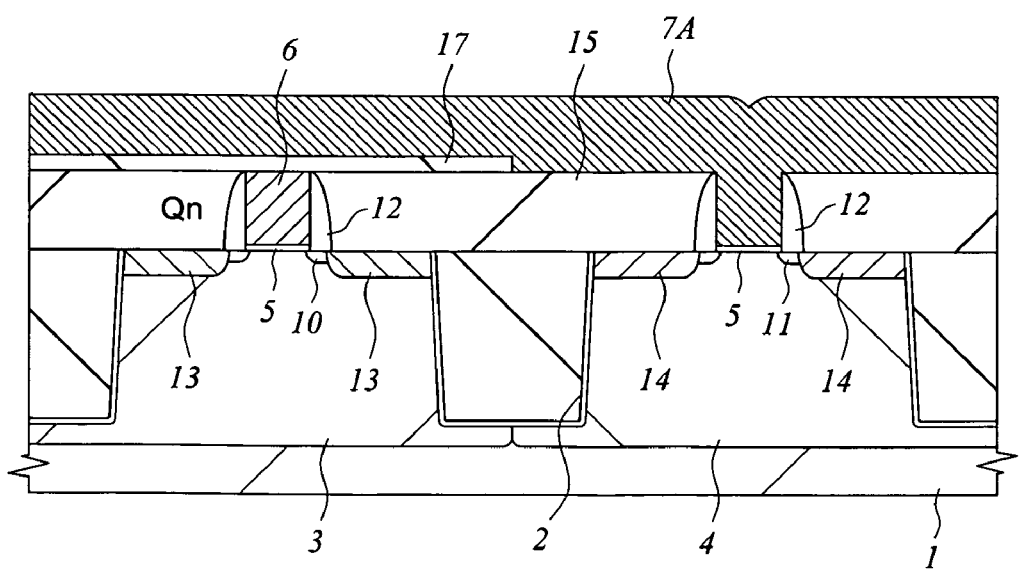
FIG. 12 is a cross-sectional view of the semiconductor substrate showing the manufacturing method of the n channel MIS transistor and the p channel MIS transistor subsequent to FIG. 11.
Figure 13:
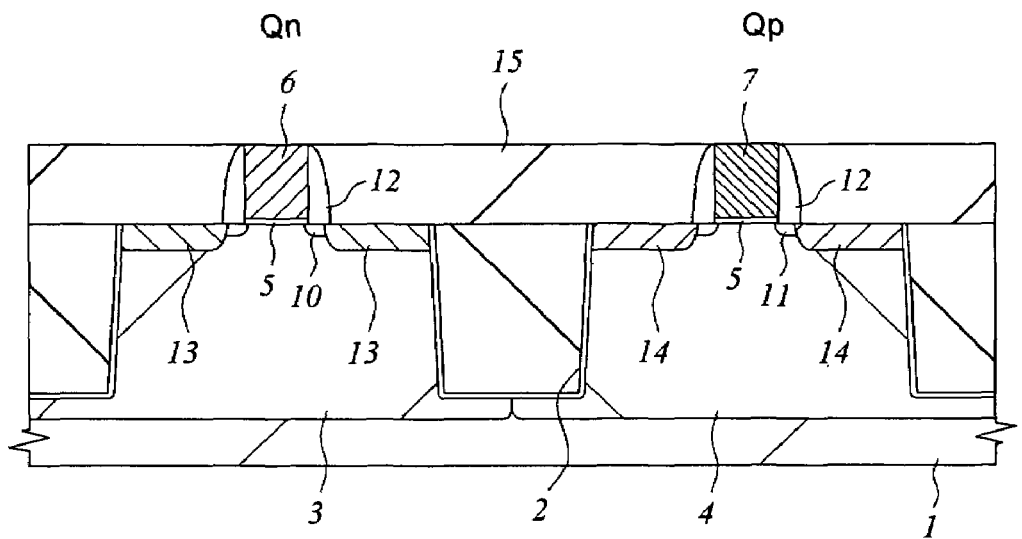
FIG. 13 is a cross-sectional view of the semiconductor substrate showing the manufacturing method of the n channel MIS transistor and the p channel MIS transistor subsequent to FIG. 12.

Next, as shown in FIG. 12, a Pt film 7A is deposited on the substrate 1 by the sputtering method so as to fill the gap on the gate insulator 5 formed by the removal of the silicon gate electrode 8 with the Pt film 7A. Subsequently, as shown in FIG. 13, the Pt film 7A on the silicon oxide film 15 is removed by the chemical mechanical polishing, and then, the silicon nitride film 17 is removed by the wet etching. Through the process as described above, the p channel MIS transistor (Qp) having the gate electrode 7 composed of the Pt film is formed on the n type well 4.

Figure 14:
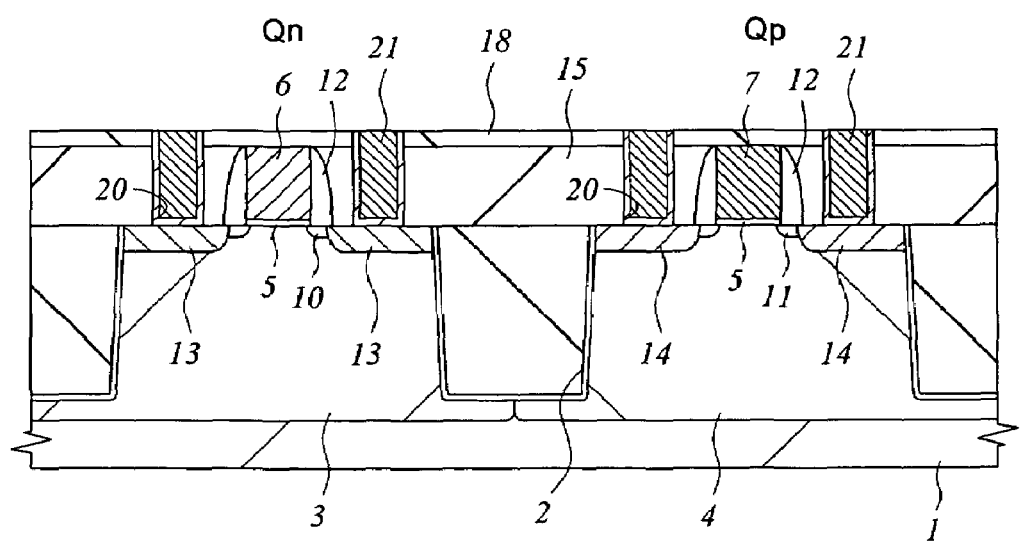
FIG. 14 is a cross-sectional view of the semiconductor substrate showing the manufacturing method of the n channel MIS transistor and the p channel MIS transistor subsequent to FIG. 13.

Next, as shown in FIG. 14, a silicon oxide film 18 is deposited on the silicon oxide film 15 by the CVD, and contact holes 20 are formed in the silicon oxide film .18 and the silicon oxide film 15 by the dry etching using a photoresist film as a mask. Thereafter, plugs 21 are formed in the contact holes 20. The plugs 21 are formed in the following manner. That is, after depositing a titanium nitride (TiN) film and a tungsten (W) film on the silicon oxide film 18 and in the contact holes 20 by the sputtering method, the TiN film and the W film on the silicon oxide film 18 are removed by the chemical mechanical polishing.

Thereafter, as shown in FIG. 1, metal wirings 22 are formed on the silicon oxide film 18. The metal wirings 22 are formed in the following manner. That is, after depositing a metal film such as a W film or an Al metal alloy film on the silicon oxide film 18 by the sputtering method, the metal film is patterned by the dry etching using a photoresist film as a mask.

Second Embodiment

The manufacturing method of an n channel MIS transistor (Qn) and a p channel MIS transistor (Qp) according to this embodiment will be described with reference to FIG. 15 to FIG. 19.

Figure 15:
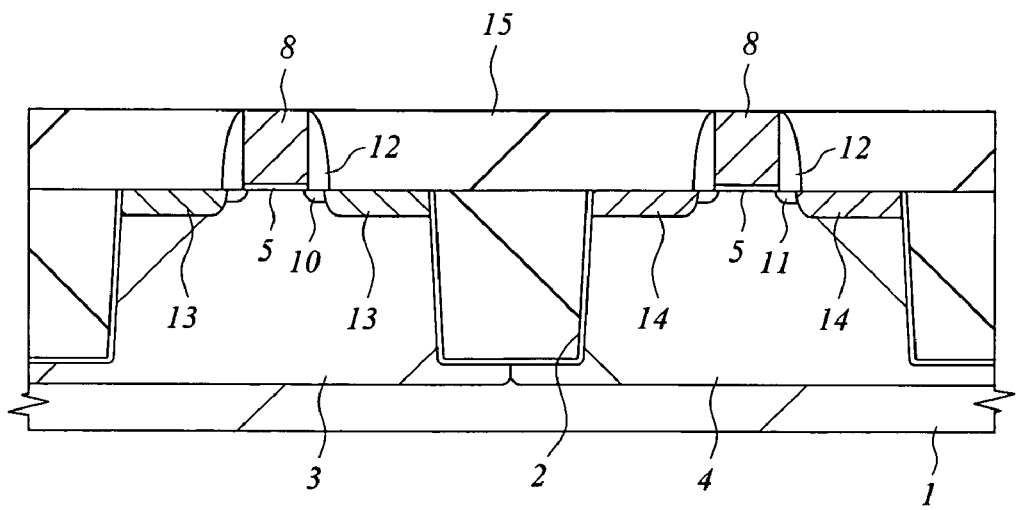
FIG. 15 is a cross-sectional view of a semiconductor substrate showing a manufacturing method of an n channel MIS transistor and a p channel MIS transistor according to another embodiment of the present invention.

First, as shown in FIG. 15, after forming the silicon gate electrode 8 on each of the gate insulators 5 of the p type well 3 and the n type well 4, the n+ type semiconductor regions (source, drain) 13 are formed in the p type well 3 and the p+ type semiconductor regions (source, drain) 14 are formed in the n type well 4. Thereafter, the surface of the silicon oxide film 15 deposited on the substrate 1 is polished and planarized, thereby exposing the surfaces of the silicon gate electrodes 8 on the surface of the silicon oxide film 15. The process so far is identical to that described in the first embodiment shown in FIG. 1 to FIG. 7.

Figure 16:
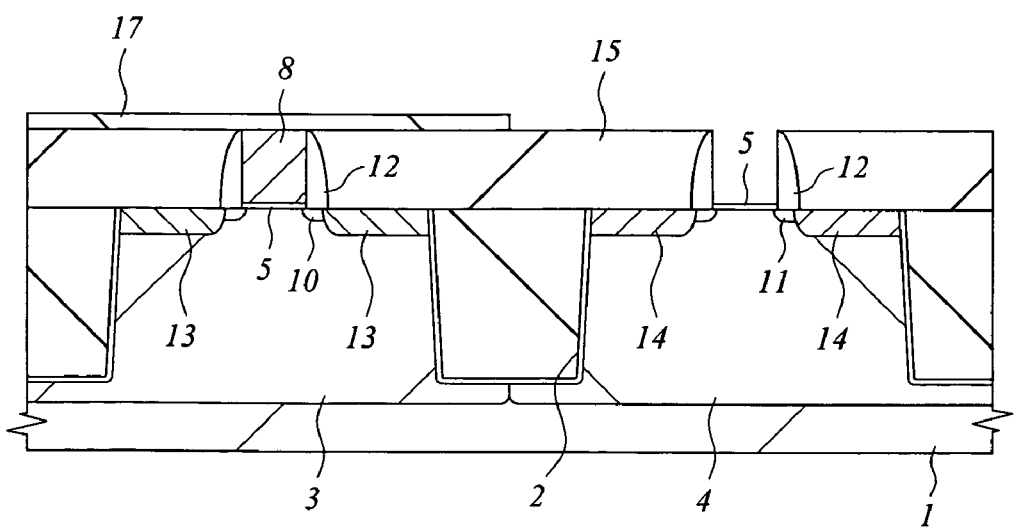
FIG. 16 is a cross-sectional view of the semiconductor substrate showing the manufacturing method of the n channel MIS transistor and the p channel MIS transistor subsequent to FIG. 15.

Next, as shown in FIG. 16, after depositing a silicon nitride film 17 on the substrate 1 by the CVD, the silicon nitride film 17 above the n type well 4 is selectively removed by the dry etching using a photoresist film as a mask, thereby exposing the surface of the silicon gate electrode 8 located on the side of the n type well 4. Subsequently, the silicon gate electrode 8 on the side of the n type well 4 is removed by the dry etching, thereby exposing the gate insulator 5 on the surface of the n type well 4.

Figure 17:
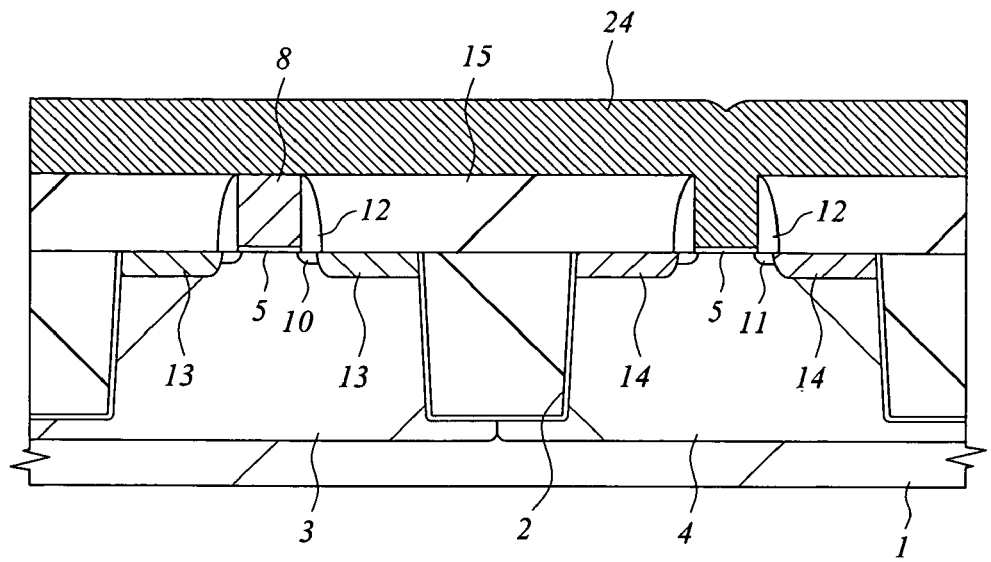
FIG. 17 is a cross-sectional view of the semiconductor substrate showing the manufacturing method of the n channel MIS transistor and the p channel MIS transistor subsequent to FIG. 16.

Next, the silicon nitride film 17 is removed by the wet etching to expose the surface of the silicon gate electrode 8 located on the side of the p type well 3. Thereafter, a Pt film 24 is deposited on the silicon oxide film 15 by the sputtering method as shown in FIG. 17. By doing so, the Pt film 24 is embedded in the gap formed on the gate insulator 5 on the surface of the n type well 4.

Figure 18:
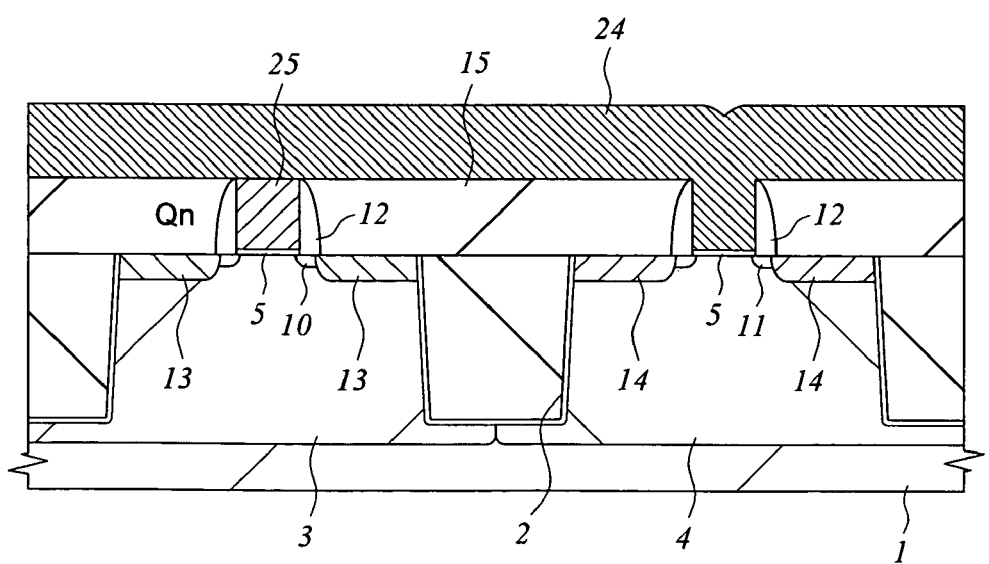
FIG. 18 is a cross-sectional view of the semiconductor substrate showing the manufacturing method of the n channel MIS transistor and the p channel MIS transistor subsequent to FIG. 17.

Next, as shown in FIG. 18, the substrate 1 is heated to about 400° C. By this heat treatment, the silicide reaction occurs from the interface between the silicon gate electrode 8 on the side of the p type well 3 and the Pt film 24 deposited thereon, and the silicon gate electrode 8 is converted into a Pt silicide film. Through the process as described above, the n channel MIS transistor (Qn) having a gate electrode 25 composed of the Pt silicide film is formed on the p type well 3.

Figure 19:
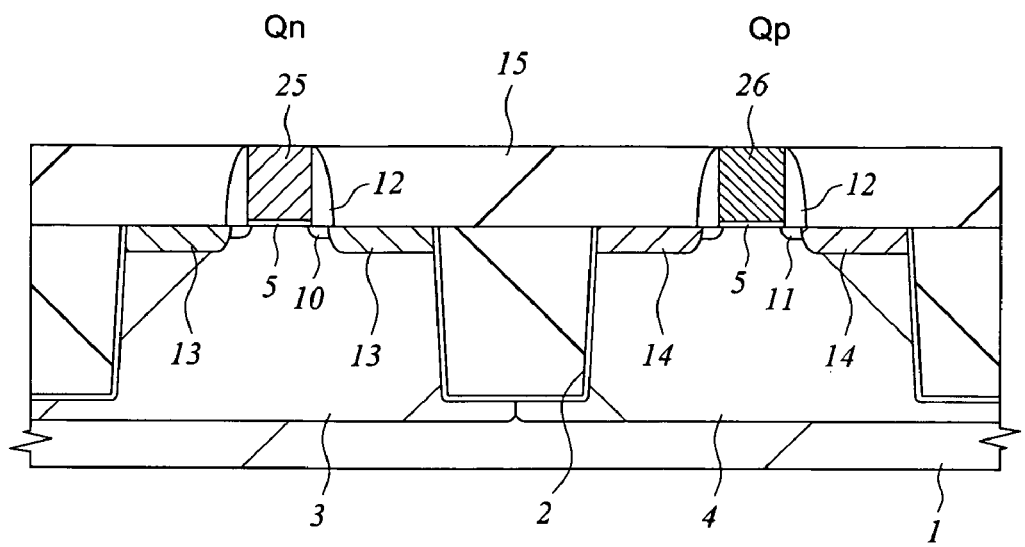
FIG. 19 is a cross-sectional view of the semiconductor substrate showing the manufacturing method of the n channel MIS transistor and the p channel MIS transistor subsequent to FIG. 18.

Next, as shown in FIG. 19, the Pt film 24 on the silicon oxide film 15 is removed by the chemical mechanical polishing to form a gate electrode 26 composed of the Pt film 24 on the gate insulator 5 on the side of the n type well 4, and thus, the p channel MIS transistor (Qp) is formed. The subsequent process is identical to that described in the first embodiment.

As shown in FIG. 2, in the case of the gate electrode made of Pt silicide, the work function thereof on the silicon oxide film is 4.8 to 4.9 eV, whereas the work function thereof on the hafnium oxide film is 4.6 to 4.7 eV and the Fermi level pinning in the direction of the conduction band of Si is observed. More specifically, the increase of the threshold voltage can be prevented also in the n channel MIS transistor (Qn) according to this embodiment. Therefore, when the n channel MIS transistor (Qn) and the p channel MIS transistor (Qp) according to this embodiment are used to constitute a CMOS circuit, the CMOS circuit capable of simultaneously achieving the high ON current and low power consumption can be realized.

Note that, since an Ni silicide film is used to constitute the gate electrode 6 of the n channel MIS transistor (Qn) in the first embodiment described above, the difference in work function from the gate electrode 7 of the p channel MIS transistor (Qp) is about 0.8 eV. Meanwhile, since a Pt silicide film is used to constitute the gate electrode 25 of the n channel MIS transistor (Qn) in this embodiment, the difference in work function from the gate electrode 26 of the p channel MIS transistor (Qp) is reduced to about 0.6 eV. However, it does not cause any problem in a practical use.

Also, according to the manufacturing method according to this embodiment, since the Pt film 24 deposited in a single film-forming step is used to form the gate electrode 25 of the n channel MIS transistor (Qn) and the gate electrode 26 of the p channel MIS transistor (Qp), the number of process steps can be reduced in comparison to the manufacturing method of the first embodiment in which the film-forming step of the Ni film 6A and the film-forming step of the Pt film 7A are required.

Also, the gate electrodes 7 and 26 of the p channel MIS transistor (Qp) are made of Pt in the first embodiment and this embodiment. However, the materials other than Pt are also available as long as they are the metal materials which do not cause the Fermi level pinning in the direction of the conduction band of Si on the hafnium oxide film or the above-described hafnium-based insulator. The metal materials having the characteristics as described above include, for example, VIII group elements of the periodic table such as W (tungsten) and Mo (molybdenum). In particular, Pt, Ru (ruthenium) and Ni are preferable.

Also, the gate electrodes 6 and 25 of the n channel MIS transistor (Qn) are not limited to those made of Ni silicide and Pt silicide, and the silicide compounds of the above-described various metal materials can be appropriately selected and used with consideration for the difference in work function from the gate electrode of the p channel MIS transistor (Qp) In this case, if the silicide compound of the metal which is the same as that constituting the gate electrode of the p channel MIS transistor (Qp) is used for the gate electrode of the n channel MIS transistor (Qn), the process steps can be simplified as described in this embodiment.

Further, a single film of Pt is used to constitute the gate electrodes 7 and 26 of the p channel MIS transistor (Qp) in the first embodiment and this embodiment. However, even the laminated film composed of a Pt film and a metal film or a metal compound film formed thereon has the work function equal to that of the single film of Pt if the Pt film of the laminated film contacts the gate insulator 5 composed of a hafnium-based insulator. Therefore, it is possible to use the laminated film as a gate electrode material of the p channel MIS transistor (Qp). For example, when a laminated film composed of a thin Pt film with a thickness of about several nm and a diffusion barrier film such as a tantalum nitride (TaN) film formed thereon is used to constitute the gate electrodes 7 and 26, the process of the gate electrodes is facilitated in comparison to that of a single film of Pt, and in addition, the deterioration of the gate electrodes due to the heat treatment can be inhibited.

Third Embodiment

In the n channel MIS transistor (Qn) according to this embodiment, the gate electrode on the gate insulator composed of a hafnium-based insulator is composed of an n type polycrystalline silicon film doped with phosphorus or arsenic or a metal silicide film made of, for example, Ni silicide. Also, in the p channel MIS transistor (Qp) according to this embodiment, the gate electrode on the gate insulator composed of a hafnium-based insulator is composed of a metal silicide film made of, for example, Pt silicide.

When a metal silicide film such as a Pt silicide film is used to constitute the gate electrode of the p channel MIS transistor (Qp), the influence of the depletion can be reduced in comparison to the case where a p type polycrystalline silicon film is used to constitute the gate electrode. Consequently, the driving force of the p channel MIS transistor (Qp) whose ON current is basically lower than that of the n channel MIS transistor (Qn) can be improved.

In addition, when an n type polycrystalline silicon film is used to constitute the gate electrode of the n channel MIS transistor (Qn), the operation speed of the n channel MIS transistor (Qn) is reduced due to the influence of the depletion caused in the gate electrode. However, since the Fermi level pinning of the n type polycrystalline silicon film on the hafnium-based insulator is small, the significant increase of the threshold voltage can be inhibited.

Also, when a Pt silicide film is used to constitute the gate electrode of the p channel MIS transistor (Qp) and an Ni silicide film is used to constitute the gate electrode of the n channel MIS transistor (Qn), the work function of the gate electrode of the p channel MIS transistor (Qp) is 4.6 to 4.7 eV, and the work function of the gate electrode of the n channel MIS transistor (Qn) is 4.4 to 4.5 eV. More specifically, since the work functions of the above-described two gate electrodes are almost symmetrical to the intermediate value (midgap: about 4.6 eV) between the work function of the n type polycrystalline silicon film (4.05 eV) and that of the p type polycrystalline silicon film (5.17 eV) on the silicon oxide film, the design of the CMOS circuit is facilitated.

Fourth Embodiment

The manufacturing method of an n channel MIS transistor (Qn) and a p channel MIS transistor (Qp) will be described with reference to FIG. 20 to FIG. 26.

Figure 20:
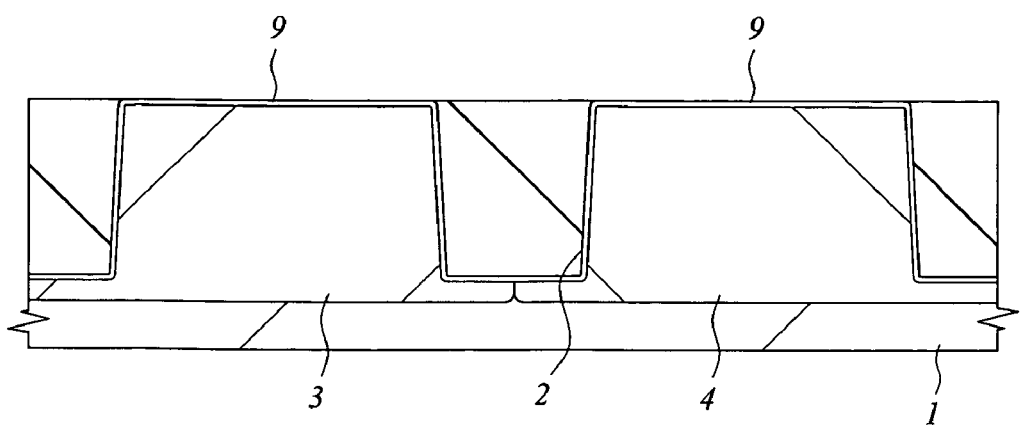
FIG. 20 is a cross-sectional view of a semiconductor substrate showing a manufacturing method of an n channel MIS transistor and a p channel MIS transistor according to another embodiment of the present invention.

First, the device isolation trenches 2, the p type well 3 and the n type well 4 are formed in the main surface of the substrate 1 by the method as described in the first embodiment in FIG. 3. Subsequently, impurities for adjusting the threshold voltage of the MIS transistors are ion-implanted into the surfaces of the p type well 3 and the n type well 4. Thereafter, as shown in FIG. 20, the gate insulator 9 made of silicon oxide is formed on each of the surfaces of the p type well 3 and the n type well 4 by the heat treatment of the substrate 1.

Figure 21:
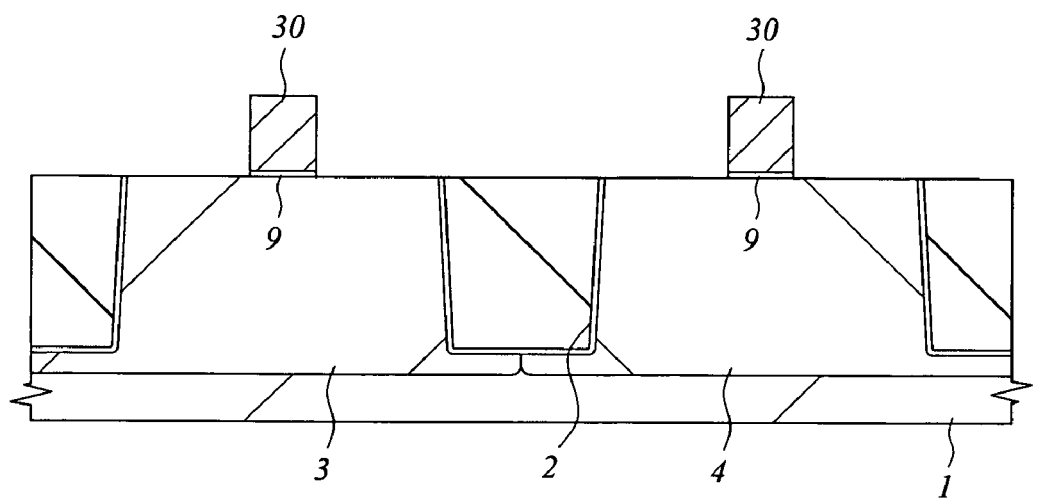
FIG. 21 is a cross-sectional view of the semiconductor substrate showing the manufacturing method of the n channel MIS transistor and the p channel MIS transistor subsequent to FIG. 20.

Next, as shown in FIG. 21, a polycrystalline silicon film (or amorphous silicon film) is deposited on the substrate 1 by the CVD. Thereafter, the polycrystalline silicon film is patterned by the dry etching using a photoresist film as a mask, thereby forming dummy gate electrodes 30 on the gate insulators 9 of the p type well 3 and the n type well 4. Note that, the material of the dummy gate electrode 30 is not limited to the silicon film, but various insulating materials with high dielectric constant and other metal materials are also available as long as they have the high etching selectivity to the silicon oxide-based insulator.

Figure 22:
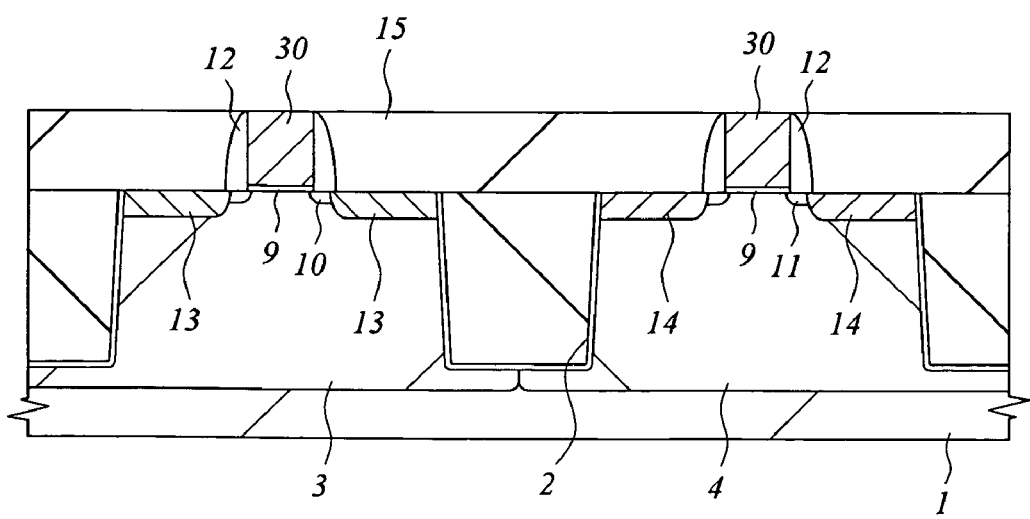
FIG. 22 is a cross-sectional view of the semiconductor substrate showing the manufacturing method of the n channel MIS transistor and the p channel MIS transistor subsequent to FIG. 21.

Next, as shown in FIG. 22, the n− type semiconductor regions 10, the p− type semiconductor regions 11, the sidewall spacers 12, the n+ type semiconductor regions (source, drain) 13, and the p+ type semiconductor regions (source, drain) 14 are sequentially formed by the method as described in the first embodiment in FIG. 6 and FIG. 7. Thereafter, the surface of the silicon oxide film 15 deposited on the substrate 1 is polished and planarized by the chemical mechanical polishing, thereby exposing the surface of the dummy gate electrodes 30 on the surface of the silicon oxide film 15.

Figure 23:
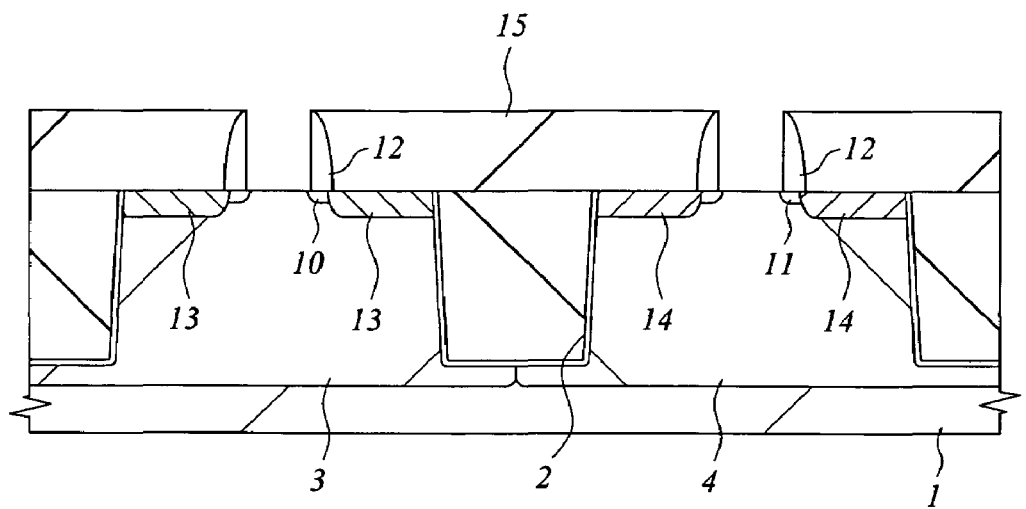
FIG. 23 is a cross-sectional view of the semiconductor substrate showing the manufacturing method of the n channel MIS transistor and the p channel MIS transistor subsequent to FIG. 22.

Next, as shown in FIG. 23, after removing the dummy gate electrodes 30 by the etching, the gate insulators 9 in the regions exposed by the removal of the dummy gate electrodes 30 are removed by the etching.

Figure 24:
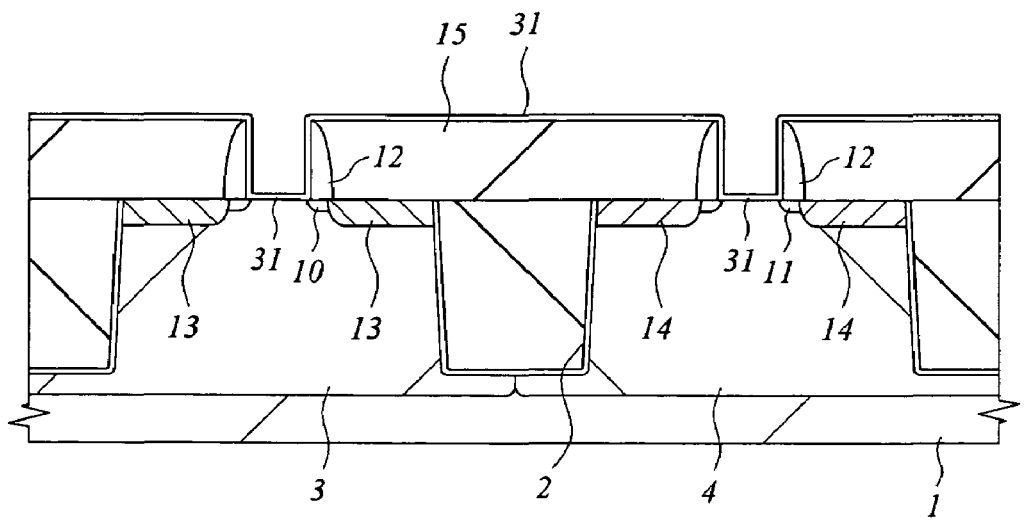
FIG. 24 is a cross-sectional view of the semiconductor substrate showing the manufacturing method of the n channel MIS transistor and the p channel MIS transistor subsequent to FIG. 23.

Next, as shown in FIG. 24, a gate insulator 31 composed of a hafnium-based insulator is formed on the inner wall of the trenches formed by the removal of the dummy electrodes 30 and on the surfaces of the substrate 1 (p type well 3, n type well 4) exposed by the removal of the gate insulators 9. Any one of the various hafnium-based insulating materials exemplified in the first embodiment is available for the gate insulator 31, and the gate insulator 31 is deposited by the CVD, the ALD or the sputtering method. Also, the thickness of the deposited gate insulator 31 is controlled so as not to fill the inside of the trenches formed by the removal of the dummy electrodes 30.

Figure 25:
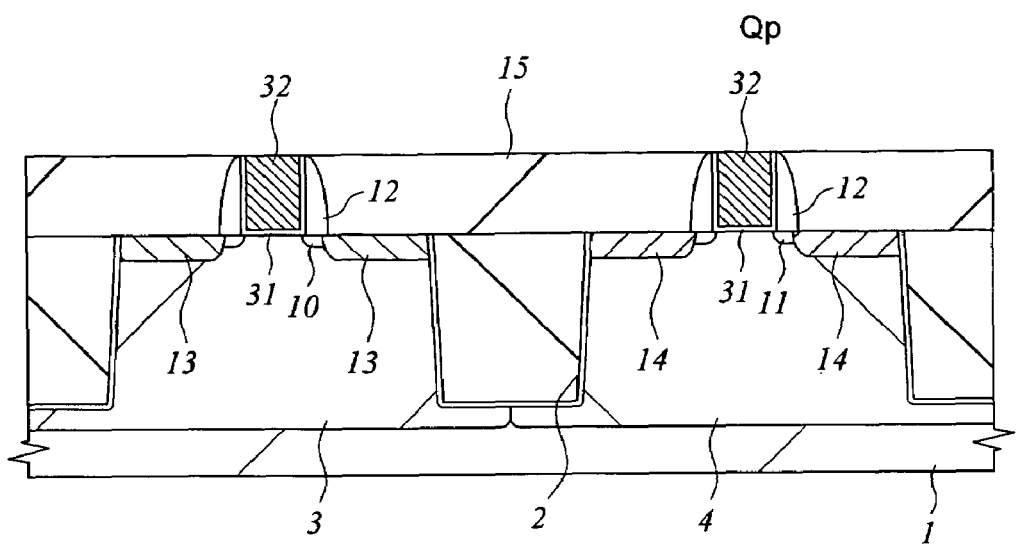
FIG. 25 is a cross-sectional view of the semiconductor substrate showing the manufacturing method of the n channel MIS transistor and the p channel MIS transistor subsequent to FIG. 24.

Next, as shown in FIG. 25, a Pt film is deposited on the gate insulator 31 by the sputtering method or the CVD to fill the trenches with the Pt film. Thereafter, the Pt film and the gate insulator 31 outside the trenches are removed by the chemical mechanical polishing. Through the process as described above, the gate electrodes 32 composed of the Pt film are formed on the p type well 3 and the n type well 4. Also, by doing so, the p channel MIS transistor (Qp) having the gate electrode 32 composed of a Pt film is formed on the n type well 4. Note that the material of the gate electrode 32 is not limited to Pt, but the VIII group element exemplified in the first and second embodiments, W or Mo are also available. In particular, Pt, Ru and Ni are preferable.

Figure 26:
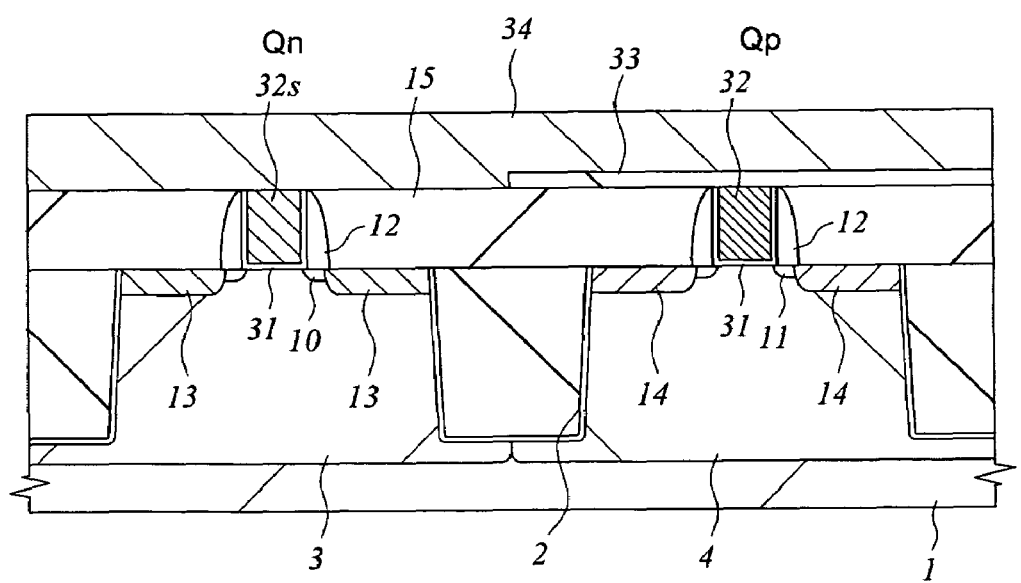
FIG. 26 is a cross-sectional view of the semiconductor substrate showing the manufacturing method of the n channel MIS transistor and the p channel MIS transistor subsequent to FIG. 25.

Next, as shown in FIG. 26, the gate electrode 32 of the p channel MIS transistor (Qp) is covered with a silicon nitride film 33 and subsequently a silicon film 34 is deposited on the silicon oxide film 15 and the silicon nitride film 33 by the sputtering method. Thereafter, the substrate 1 is heated to about 400° C. By doing so, the silicide reaction occurs from the interface between the gate electrode 32 composed of the Pt film on the p type well 3 and the silicon film 34, and the gate electrode 32 on the p type well 3 is converted into a gate electrode 32s made of Pt silicide.

Through the process as described above, the n channel MIS transistor (Qn) having the gate electrode 32s composed of a Pt silicide film is formed on the p type well 3. At this time, since the surface of the gate electrode 32 of the p channel MIS transistor (Qp) composed of the Pt film is covered with the silicon nitride film 33, the gate electrode 32 does not react with the silicon film 34 even if the above-described heat treatment is performed. Thereafter, the silicon film 34 and the silicon nitride film 33 are removed by the etching and the subsequent process is identical to that of the first embodiment. Therefore, its description is omitted.

In the manufacturing method according to this embodiment, the gate insulator 31 is formed in the step just before the step of depositing a Pt film which constitutes the gate electrode 32. Therefore, the contamination and the degradation of the gate insulators 31 can be prevented and the reliability of the n channel MIS transistor (Qn) and the p channel MIS transistor (Qp) is improved.

In the foregoing, the inventions made by the inventors of the present invention have been concretely described based on the embodiments. However, it is needless to say that the present invention is not limited to the foregoing embodiments and various modifications and alterations can be made within the scope of the present invention.

The present invention can be applied to the semiconductor device in which the n channel MIS transistor and the p channel MIS transistor having the Hf-based gate insulator are used to form a CMOS circuit.

What is claimed is:

1. A method of manufacturing a semiconductor device in which an n channel MIS transistor is formed in a first region on a main surface of a semiconductor substrate made of single crystal silicon and a p channel MIS transistor is formed in a second region on said main surface, said method comprising the steps of:

(a) forming a gate insulator mainly containing hafnium oxide on the main surface of said semiconductor substrate;

(b) after said step (a), forming a first silicon gate electrode of said n channel MIS transistor on said gate insulator in said first region and forming a second silicon gate electrode of said p channel MIS transistor on said gate insulator in said second region;

(c) after said step (b), depositing a first insulator with a thickness larger than that of said first and second silicon gate electrodes on the main surface of said semiconductor substrate, and then, planarizing the surface of said first insulator, thereby exposing each of the surfaces of said first and second silicon gate electrodes on the surface of said first insulator;

(d) after said step (c), selectively covering the surface of said second silicon gate electrode exposed on the surface of said first insulator with a second insulator, and then, forming a first metal film on said first and second insulators;

(e) after said step (d), heating said semiconductor substrate to react said first silicon gate electrode contacting with said first metal film, thereby converting said first silicon gate electrode of said n channel MIS transistor into a metal silicide gate electrode;

(f) after said step (e), removing said second insulator, and then, removing said second silicon gate electrode such that said gate insulator thereunderneath remains; and (g) after said step (f), filling a gap formed by the removal of said second silicon gate electrode with a second metal film, thereby forming a metal gate electrode of said p channel MIS transistor over said gate insulator.

2. The method of manufacturing a semiconductor device according to claim 1, wherein said first and second metal films are made of a VIII group element.

3. The method of manufacturing a semiconductor device according to claim 2, wherein said first and second metal films are a platinum film, a nickel film, or a ruthenium film.

4. The method of manufacturing a semiconductor device according to claim 1, wherein said first and second metal films are made of elements different from each other.

5. A method of manufacturing a semiconductor device in which an n channel MIS transistor is formed in a first region on a main surface of a substrate made of single crystal silicon and a p channel MIS transistor is formed in a second region on said main surface, said method comprising the steps of:

(a) forming a gate insulator mainly containing hafflium oxide on the main surface of said semiconductor substrate;

(b) after said step (a), forming a first silicon gate electrode of said n channel MIS transistor on said gate insulator in said first region and forming a second silicon gate electrode of said p channel MIS transistor on, said gate insulator in said second region;

(c) after said step (b), depositing a first insulator with a thickness larger than that of said first and second silicon gate electrodes on the main surface of said semiconductor substrate, and then, planarizing the surface of said first insulator, thereby exposing each of the surfaces of said first and second silicon gate electrodes on the surface of said first insulator;

(d) after said step (c), removing said second silicon gate electrode such that said gate insulator thereunderneath remains;

(e) after said step (d), forming a metal film on said first insulator, said gate insulator and in a gap formed by the removal of said second silicon gate electrode;

(f) after said step (e), heating said semiconductor substrate to react said first silicon gate electrode contacting with said metal film, thereby converting said first silicon gate electrode of said n channel MIS transistor into a metal silicide gate electrode; and (g) after said step (f), removing said metal film on said first insulator to leave said metal filmy in said gap, thereby forming a metal gate electrode of said p channel MIS transistor in said gap.

6. The method of, manufacturing a semiconductor devise according to claim 5, wherein said metal film is made of a VIII group element.

7. The method of manufacturing a semiconductor device according to claim 6, wherein said metal film is a platinum film, a nickel film, or a ruthenium film.

8. A method of manufacturing a semiconductor device in which an n channel MIS transistor is formed in a first region on a main surface of a substrate made of single crystal silicon and a p channel MIS transistor is formed in a second region on said main surface, said method comprising the steps of:

(a) forming a dummy gate insulator on the main surface of said semiconductor, substrate;

(b) after said step (a), forming a first dummy gate electrode on said dummy gate insulator in said first region and forming a second dummy gate electrode on said dummy gate insulator in said second region;

(c) after said step (b), depositing a first insulator with a thickness larger 20 than that of said first and second dummy gate electrodes on the main surface of said semiconductor substrate, and then, planarizing the surface of said first insulator, thereby exposing each of the surfaces of said first and second dummy gate electrodes on the surface of said first insulator;

(d) after said step (c), removing said first and second dummy gate electrodes;

(e) after said step (d), removing said dummy gate insulator in the region exposed by the removal of said first and second dummy gate electrodes;

(f) after said step (e), forming a gate insulator mainly containing hafnium oxide and having a thickness which does not fill the inside of a trench on the inner wall of the trench formed by the removal of said first and second dummy gate electrodes and on the surface of said semiconductor substrate exposed by the removal of said dummy gate insulator;

(g) after said step (f), filling said trench, with a metal film, thereby forming a metal gate electrode of said n channel MIS transistor and a metal gate electrode of said p channel MIS transistor; (h) after said step (g), selectively covering a surface of the metal gate electrode of said p channel MIS transistor with a second insulator, and then, forming a silicon film on said first and second insulators; and (i) after said step (h), heating said semiconductor substrate to react the metal gate electrode of said n channel MIS transistor contacting with said silicon film, thereby converting the metal gate electrode of said n channel MIS transistor into a metal silicide gate electrode.

9. The method of manufacturing a semiconductor device according to claim 8, wherein said metal film is a platinum film, a nickel film, or a ruthenium film.

10. The method of manufacturing a semiconductor, device according to claim 1, wherein said gate insulator mainly contains at least one kind of hafnium oxide selected from a group including HfO, Hf—Si—O, Hf—Si—O—N, Hf—Al—O and Hf—Al—O—N.

11. The method of manufacturing a semiconductor device according to claim 5, wherein said gate insulator mainly contains at least one kind of hafnium oxide selected from a group including HfO, Hf—Si—O, Hf—Si—O—N, Hf—Al—O and Hf—Al—O—N.

12. The method of manufacturing a semiconductor device according to claim 8, wherein said gate insulator mainly contains at least one kind of hafnium oxide selected from a group including HfO, Hf—Si—O, Hf—Si—O—N, Hf—Al—O and Hf—Al—O—N.

* * * * *